United States Patent
Tanaka

(10) Patent No.: US 6,377,465 B1
(45) Date of Patent: Apr. 23, 2002

(54) PRINTING WIRING BOARD

(75) Inventor: Yasunori Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/482,113

(22) Filed: Jan. 13, 2000

(30) Foreign Application Priority Data

Jan. 14, 1999 (JP) .......................................... 11-007716

(51) Int. Cl.⁷ ................................................ H05K 7/02
(52) U.S. Cl. ...................................... 361/760; 439/936
(58) Field of Search ................................ 361/760, 761; 439/936

(56) References Cited

U.S. PATENT DOCUMENTS

| | | | | |
|---|---|---|---|---|
| 4,540,226 A | * | 9/1985 | Thompson et al. ............ 439/17 |
| 4,675,787 A | * | 6/1987 | Suwa .......................... 361/401 |
| 5,253,010 A | * | 10/1993 | Oku et al. .................... 354/485 |
| 5,386,624 A | * | 2/1995 | George et al. ................. 29/832 |
| 5,535,512 A | * | 7/1996 | Armogan ...................... 29/877 |
| 5,735,697 A | * | 4/1998 | Muzslay ....................... 439/83 |
| 5,796,039 A | * | 8/1998 | Daoud .......................... 174/59 |
| 5,822,194 A | * | 10/1998 | Horiba et al. ................. 361/760 |
| 5,835,352 A | * | 11/1998 | Matsuzaki et al. ........... 361/707 |
| 5,848,462 A | * | 12/1998 | Sera et al. ..................... 29/622 |
| 6,056,606 A | * | 5/2000 | Daoud ......................... 439/888 |
| 6,147,869 A | * | 11/2000 | Furnival ...................... 361/719 |
| 6,158,884 A | * | 12/2000 | Lebby et al. ................. 368/282 |
| 6,164,531 A | * | 12/2000 | Harris et al. ................. 235/380 |
| 6,175,509 B1 | * | 1/2001 | Koch .......................... 361/809 |

FOREIGN PATENT DOCUMENTS

| | | | | |
|---|---|---|---|---|
| JP | 50-148861 | | 11/1975 | |
| JP | 62-84954 | | 5/1987 | |
| JP | 63-152195 | | 6/1988 | |
| JP | 1-189989 | | 7/1989 | |
| JP | 4-192397 | | 7/1992 | |
| JP | 4-221892 | | 8/1992 | |
| JP | 7-228083 | | 8/1995 | |
| JP | 236665 | * | 9/1996 | .......... H01L/23/34 |
| JP | 10-200012 | * | 7/1998 | .......... H01L/23/12 |

* cited by examiner

Primary Examiner—Tulsidas Patel
(74) Attorney, Agent, or Firm—Young & Thompson

(57) ABSTRACT

There is provided a printed wiring board having upper and lower surfaces, including a resin layer formed in a predetermined region on the upper and/or lower surfaces, the resin layer integrally adhered to the printed wiring board and having a thickness sufficient to reinforce rigidity of the printed wiring board. For instance, when the printed wiring board includes an electric part having an exposed contact surface, on the upper and/or lower surfaces, the resin layer is not formed on the upper and/or lower surfaces. In accordance with the present invention, it is possible to reinforce a printed wiring board without an increase in weight.

2 Claims, 4 Drawing Sheets

PRINTING WIRING BOARD

BACKGROUND OF THE INVENTION

1. Field of the Invention

The invention relates to a printed wiring board, and more particularly to reinforcement of a printed wiring board to be used in a portable electronic device such as a portable radio-phone. In the specification, the term "printed wiring board" includes both a rigid board and a flexible board.

2. Description of the Related Art

A portable electronic device has to have a strength sufficient to withstand oscillation and/or impact which occurs when a user carries the portable electronic device with him. In other words, a printed wiring board is required to have such a mechanical strength that reliability of an electric circuit formed by mounting electric and/or electronic parts on a printed wiring board is not harmfully influenced by such oscillation and/or impact as mentioned above.

In order to meet such requirement, a conventional portable electronic device has been designed to have a reinforced cover in order to protect the above-mentioned electric circuit.

However, this solution is accompanied with a problem that a weight of the portable electronic device increases, resulting in reduction in portability.

It is preferable that a printed wiring board has high rigidity and high strength in order to protect an electric circuit, however, which would be accompanied with a problem of an increase in weight.

When an electric circuit comprised of a printed wiring board and CSP (chip-size package) parts soldered to the printed wiring board is to be protected in a conventional printed wiring board, there was carried out the method including the steps of applying an adhesive below or around CSP parts to thereby make the printed wiring board and CSP parts integral with each other, and soldering CSP parts onto the printed wiring board.

This method is advantageous to a portable radio-phone to some degree. However, the step of applying an adhesive into a gap formed between a printed wiring board and CSP parts takes much time and is laborious. In addition, the step of applying an adhesive around CSP parts does not provide sufficient strength.

In order to solve the above-mentioned problems, there have been suggested a lot of solutions.

For instance, Japanese Unexamined Patent Publication No. 4-221892 has suggested a printed wiring board reinforced by a protection cover composed of foaming material such as synthetic resin. The suggested printed wiring board is provided with a frame engaged thereto and having a sidewall surrounding the printed wiring board and having a predetermined height. The protection cover is supported in the frame. As a result, this printed wiring board is accompanied with a problem of an increase in weight.

Japanese Unexamined Utility Model Publication No. 62-84954 has suggested a reinforcement having a U-shaped cross-section. The reinforcement is formed with a groove into which a printed wiring board is inserted at an edge thereof, and an outwardly projecting rib. This suggestion is accompanied with a problem that a reinforcement has to be fabricated separately from a printed wiring board, and hence, it is unavoidable that the number of parts is increased.

Japanese Unexamined Patent Publication No. 63-152195 has suggested a circuit board comprised of a flexible board on which a circuit is formed, and a resin layer covering a surface of the flexible board. The resin layer is formed with an opening through which a part of the circuit appears.

Japanese Unexamined Patent Publication No. 1-189989 has suggested a method of fabricating a molded board, comprising the steps of forming a resist on an electrically conductive substrate in a pattern reversed to a desired pattern, carrying out electroplating to thereby form the desired pattern, forming an insulating thermosetting adhesive film in half-cured condition, the film having an opening at which electronic parts make electrical contact with the desired pattern, adhering the electronic parts to the substrate and electrically connecting the electronic parts to the desired pattern, thermally curing the insulating thermosetting adhesive film, and separating a thin film molding substrate including the desired pattern and the electronic parts, from the electrically conductive substrate.

Japanese Unexamined Patent Publication No. 50-148861 has suggested a printed circuit comprising a substrate composed of thermoplastic plastic film having poor heat-resistance, a circuit formed on the substrate, a cover coat covering almost all region of the circuit therewith, and a hard multi-layered plate adhered to a region of the circuit which region includes a terminal through which the circuit is to be connected to other element. A portion of the substrate at which the terminal is located is removed.

Japanese Unexamined Patent Publication No. 7-228083 has suggested an IC card module comprised of a substrate on which a wiring pattern is formed, an IC chip mounted on the substrate and having a terminal making contact with the wiring pattern, a seal for sealing both IC chip and the entirety of the wiring pattern therewith.

Japanese Unexamined Patent Publication No. 4-192397 has suggested a mold structure comprising a substrate on which a plurality of chips are mounted, the chips being molded with resin so as to define at least a part of a cover.

SUMMARY OF THE INVENTION

In view of the above-mentioned problems in the conventional printed wiring boards, it is an object of the present invention to provide a printed wiring board having an enhanced mechanical strength without an increase in weight.

There is provided a printed wiring board having upper and lower surfaces, including a resin layer formed in a predetermined region on at least one of the upper and lower surfaces, the resin layer integrally adhered to the printed wiring board and having a thickness sufficient to reinforce rigidity of the printed wiring board.

It is preferable that the resin layer is formed by transfer molding.

It is preferable that the printed wiring board further includes an electric part having an exposed contact surface, formed on one of the upper and lower surfaces, the resin layer being not formed on the one of the upper and lower surfaces.

For instance, the electric part is a push-button type switch.

It is preferable that the printed wiring board further includes a first electric part other than a second electric part having an exposed contact surface, the resin layer being formed so as to cover the first electric part therewith.

It is preferable that the first electric part having a lead soldered, wire-bonded or flipchip-bonded to the printed wiring board, the resin layer being formed so as to cover the lead therewith.

It is preferable that the electric part is a chip-size package (CSP), the resin layer being formed such that a gap between the chip-size package and the printed wiring board is filled with the resin layer.

It is preferable that the printed wiring board is covered with the resin layer at edges thereof extending in parallel with a thickness-wise direction thereof, the resin layer defining a rib having a thickness greater than a thickness of the printed wiring board.

It is preferable that the rib is comprised of first portions formed along first edges of the printed wiring board, second portions formed along second edges of the printed wiring board, the second edges extending perpendicularly to the first edges, and at least one third portion extending between the first portions and/or between the second portions.

It is preferable that the resin layer defines a frame for supporting a part therein.

It is preferable that the frame is a frame for supporting a liquid crystal display to be used for a cellular phone.

It is preferable that the printed wiring board further includes a cover in which the printed wiring board is to be accommodated, the resin layer having such a shape that the printed wiring board is able to be engaged to the cover through the resin layer.

It is preferable that the resin layer has a shape to be fittable into the cover.

In accordance with the present invention, it is possible to strengthen a printed wiring board without an increase in weight, and also possible to cause a resin layer to be used for strengthening a printed wiring board, to either define a frame for supporting a part such as liquid crystal display therein or have such a shape that the resin layer is fittable into a cover in which a printed wiring board is to be accommodated.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1A:
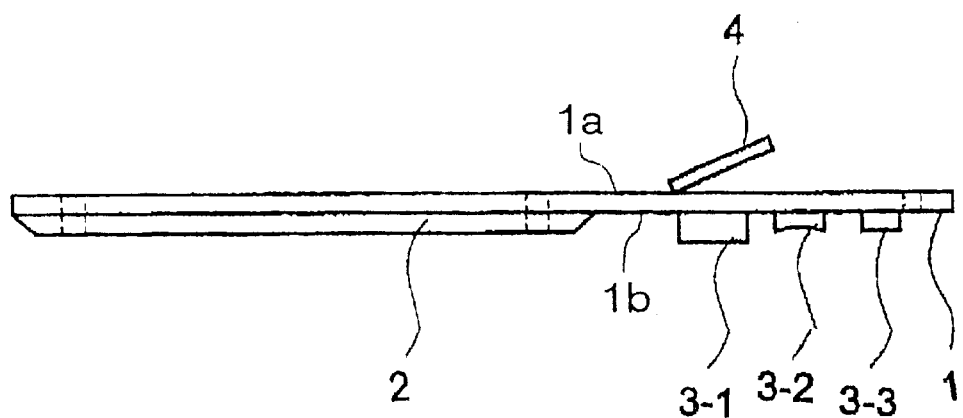
FIGS. 1A and 1B include a side and a bottom view, respectively, of a printed wiring board in accordance with a first embodiment of the present invention.
Figure 1B:
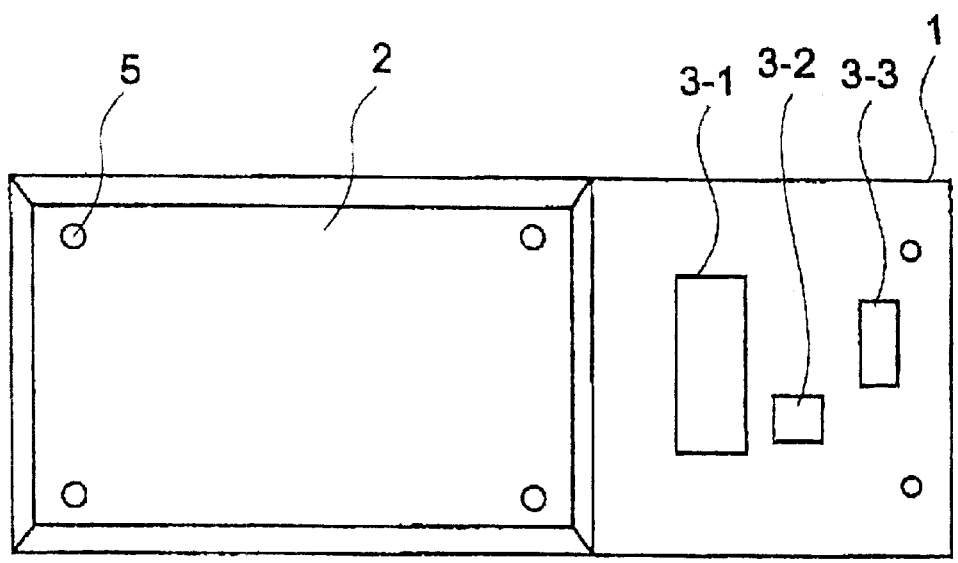

FIGS. 1A and 1B illustrate a printed wiring board in accordance with the first embodiment.

The illustrated printed wiring board is comprised of a board 1 having an upper surface 1a and a lower surface 1b, a resin layer 2 formed on the lower surface 1b of the board 1 in left-half thereof, electric parts 3-1, 3-2 and 3-3 mounted on the lower surface 1b of the board 1 in right-half thereof, and a push-type switch 4 having an exposed contact, formed on the upper surface 1a of the board 1. The board 1 and the resin layer 2 are formed therethrough with through-holes 5 through which a bolt (not illustrated) is inserted.

In the printed wiring board in accordance with the first embodiment, the resin layer 2 is formed on the lower surface 1b on which the electric parts 3-1, 3-2 and 3-3 are also mounted. The resin layer 2 is formed only in left-half of the lower surface 1b, and hence, the electric parts 3-1, 3-2 and 3-3 are not covered with the resin layer 2.

The push-type switch 4 has a contact exposed outwardly. If the resin layer 2 is formed also on the upper surface 1a of the board 1, the contact could not properly work. Hence, the resin layer 2 is not formed on the upper surface 1a of the board 1.

FIGS. 2A and 2B illustrate a printed wiring board in accordance with the second embodiment.

The illustrated printed wiring board is comprised of a board 1 having an upper surface 1a and a lower surface 1b, a resin layer 2 formed on the lower surface 1b of the board 1, electric parts 3-4, 3-5 and 3-6 mounted on the lower surface 1b of the board 1 in right-half thereof, and a push-type switch 4 having an exposed contact, formed on the upper surface 1a of the board 1. The board 1 and the resin layer 2 are formed therethrough with through-holes 5 through which a bolt (not illustrated) is inserted.

Contrary to the first embodiment illustrated in FIG. 1, the electric parts 3-4, 3-5 and 3-6 are covered with the resin layer 2 in the second embodiment.

The resin layer 2 may be formed by transfer molding. Since leads (not illustrated) extending between the electric parts 3-4, 3-5 and 3-6 and the board 1 for electrically connecting them to each other are fixed in the resin layer 2, a circuit including such leads is well protected from oscillation and/or impact.

In transfer molding, simplified molds may be used in dependence on the number of products to be fabricated.

Since the lower surface 1b of the board 1 is reinforced, it would be possible to enhance operability of the push-type switch 4 mounted on the upper surface 1a.

In accordance with transfer molding, if the electric part 3-4, for instance, is comprised of CSP, it would be possible to fill a gap formed below CSP, with the resin layer 2.

If leads of the electric parts 3-4, 3-5 and 3-6 are not soldered to the board 1, but wire-bonded or flipchip-bonded to the board 1, it would be possible to well protect a circuit including the leads.

Figure 3A:
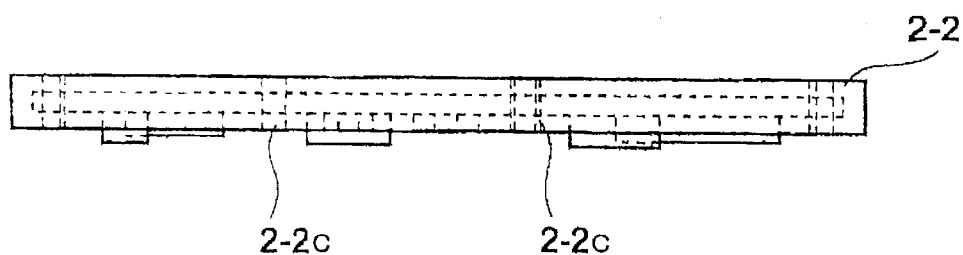
FIGS. 3A and 3B include a side and a bottom view, respectively, of a printed wiring board in accordance with a third embodiment of the present invention.
Figure 3B:
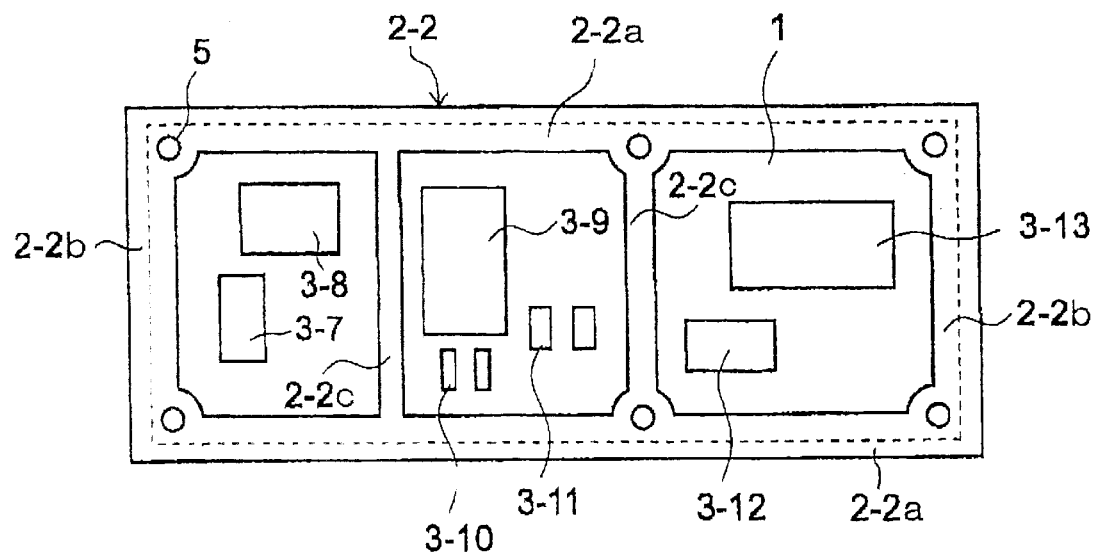

FIGS. 3A and 3B illustrate a printed wiring board in accordance with the third embodiment.

The illustrated printed wiring board is comprised of a board 1 having an upper surface 1a and a lower surface 1b, a resin layer 2 formed on the lower surface 1b of the board 1, and electric parts 3-7, 3-8, 3-9, 3-10, 3-11, 3-12 and 3-13 mounted on the lower surface 1b of the board 1. The board 1 and the resin layer 2 are formed therethrough with through-holes 5 through which a bolt (not illustrated) is inserted.

In the third embodiment, the resin layer 2 formed on the lower surface 1b of the board 1 defines a rib 2-2. The rib 2-2 is comprised of first portions 2-2a formed along first edges of the board 1 extending in a length-wise direction of the board 1, second portions 2-2b formed along second edges of the board 1, extending perpendicularly to the first edges, namely, extending in a width-wise direction of the board 1, and third portions 2-2c extending between the first portions 2-2a, namely, extending in parallel with the second portions 2-2b.

Thus, the rib 2-2 is formed such that the board 1 is covered with the resin layer 2 at edges or side surfaces thereof extending in parallel with a thickness-wise direction thereof. The first portions 2-2a and the second portions 2-2b of the rib 2-2 are designed to have a thickness greater than a thickness of the board 1.

The formation of the rib 2-2 by the resin layer 2 increases a mechanical strength of the board 1 in a smaller weight than a weight of the resin layer 2 formed entirely over the lower surface 1b of the board 1.

In general, side surfaces of the board 1 are exposed, which might result in that power of material of which the board 1 is composed is generated from the exposed side surfaces of the board 1, and electronic devices mounted on the board 1 are contaminated with such power. In addition, if side surfaces of the board 1 were exposed, the board 1 might be cracked at the exposed side surfaces due to impact generated when the board 1 is processed, for instance, cut, ground or compressed. The rib 2-2 would protect the board 1 from such impact.

Figure 2:
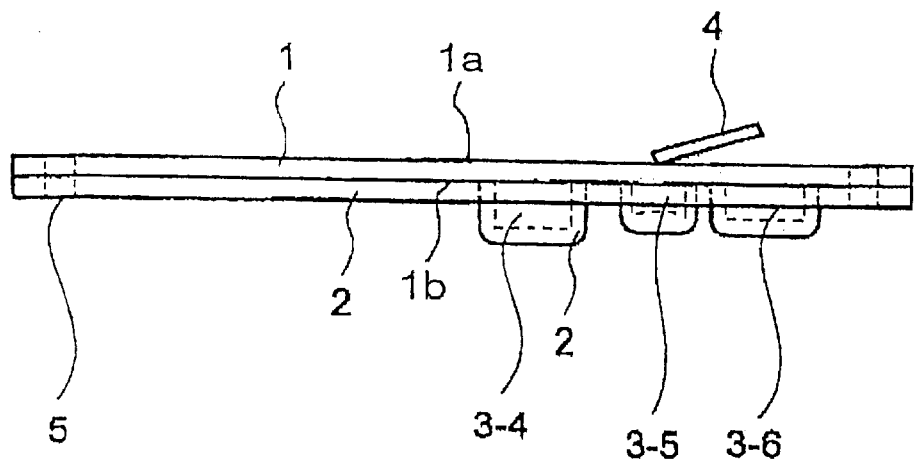
FIGS. 2A and 2B include a side and a bottom view, respectively, of a printed wiring board in accordance with a second embodiment of the present invention.
Figure 2:
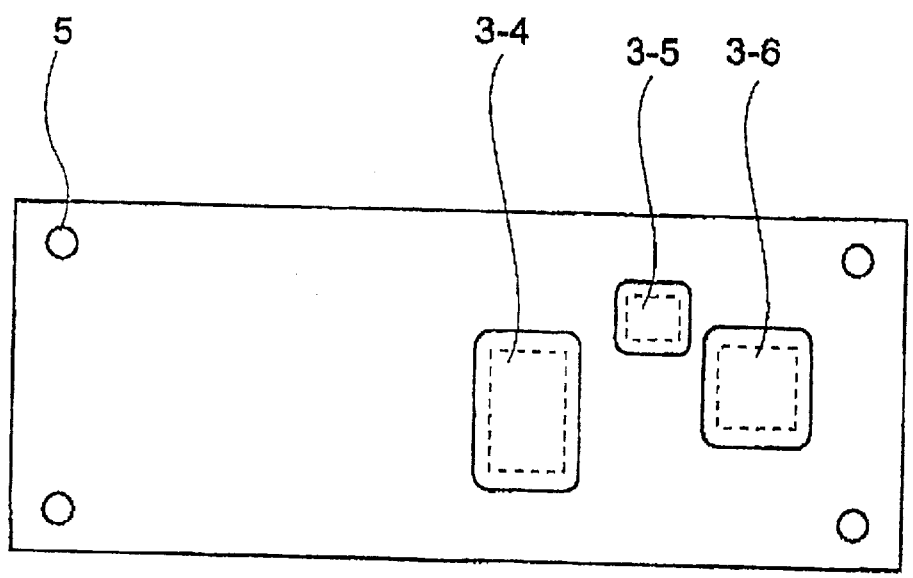

Though the electric parts 3-7, 3-8, 3-9, 3-10, 3-11, 3-12 and 3-13 are not covered with the resin layer 2 in the third embodiment, they might be covered with the resin layer 2 similarly to the second embodiment illustrated in FIG. 2.

Figure 4A:
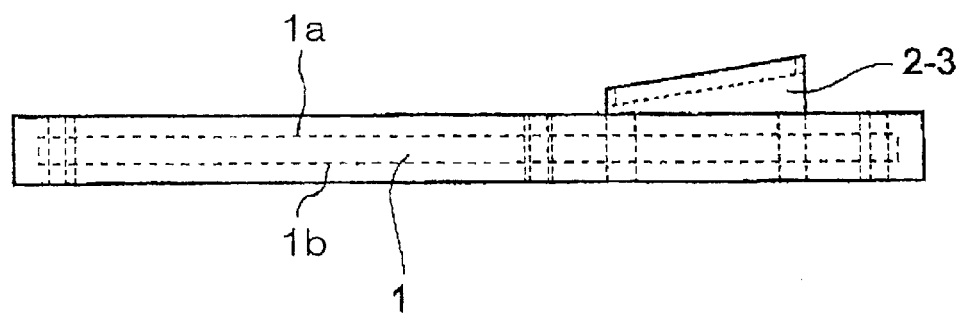
FIGS. 4A and 4B include a side and a bottom view, respectively, of a printed wiring board in accordance with a fourth embodiment of the present invention.
Figure 4B:
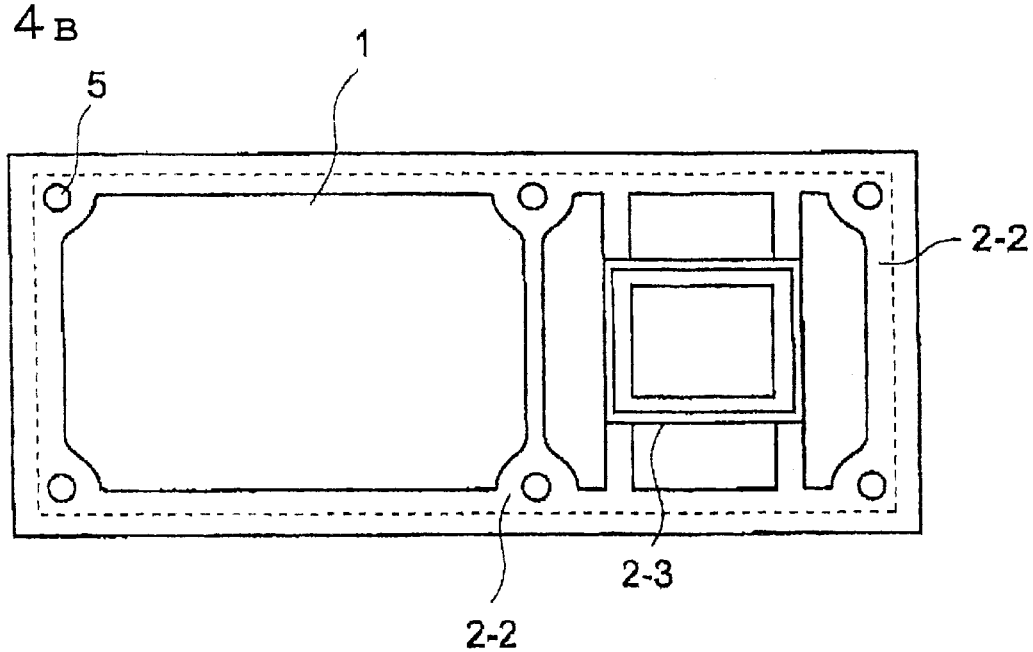

FIGS. 4A and 4B illustrate a printed wiring board in accordance with the fourth embodiment.

The illustrated printed wiring board is comprised of a board 1 having an upper surface 1a and a lower surface 1b, and a resin layer 2 formed on both the upper and lower surfaces 1a and 1b of the board 1. The board 1 and the resin layer 2 are formed therethrough with through-holes 5 through which a bolt (not illustrated) is inserted.

In the fourth embodiment, the resin layer 2 defines a rib 2-2 on each of the upper and lower surfaces 1a and 1b. The rib 2-2 has the same structure as the structure of the rib 2-2 of the third embodiment. In addition, the rib 2-2 formed on the upper surface 1a defines a frame 2-3 for supporting therein a liquid crystal display (not illustrated) to be used for a cellular phone. Other parts such as a micro-phone, a sounder or a vibrator may be supported in the frame 2-3.

Though not illustrated, when the board 1 is to be accommodated in a cover, the resin layer 2 may be designed to have such a shape that the board 1 is fittable into the cover. By designing the resin layer 2 to have such a shape, it is possible to omit formation of the through-holes 5, which further enhances a mechanical strength of the board 1.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-7716 filed on Jan. 14, 1999 including specification, claims, drawings and summary is incorporated herein by reference in its entirety.

What is claimed is:

1. A printed wiring board having upper and lower surfaces comprising:

a resin layer formed in a predetermined region on at least one of said upper and lower surfaces, said resin layer integrally adhered to said printed wiring board and having a thickness sufficient to reinforce rigidity of said printed wiring board, wherein said printed wiring board is covered with said resin layer at edges thereof extending in parallel with a thickness wise direction thereof, said resin layer defining a rib having a thickness greater than a thickness of said printed wiring board.

2. The printed wiring board as in claim 1, wherein said rib is comprised of first portions formed along first edges of said printed wiring board, second portions formed along second edges of said printed wiring board, said second edges extending perpendicularly to said first edges, and at least a third portion extending between said first portions and/or between said second portions.

* * * * *

UNITED STATES PATENT AND TRADEMARK OFFICE
CERTIFICATE OF CORRECTION

PATENT NO. : 6,377,465 B1
DATED : April 23, 2002
INVENTOR(S) : Yasunori Tanaka

It is certified that error appears in the above-identified patent and that said Letters Patent is hereby corrected as shown below:

<u>Title page,</u>
Item [54], Title, change "PRINTING" to -- PRINTED --.

Signed and Sealed this

Tenth Day of September, 2002

*Attest:*

*Attesting Officer*

JAMES E. ROGAN
*Director of the United States Patent and Trademark Office*